United States Patent
Chen et al.

(10) Patent No.: US 6,194,279 B1
(45) Date of Patent: Feb. 27, 2001

(54) FABRICATION METHOD FOR GATE SPACER

(75) Inventors: Chun-Lung Chen, Tainan Hsien; Hsi-Chin Lin, Hsinchu Hsien; Hsi-Mao Hsiao, Hsinchu; Wen-Hua Cheng, Hsinchu Hsien, all of (TW)

(73) Assignees: United Silicon Incorporated; United Microelectronics Corp., both of Hsinchu (TW)

( * ) Notice: Subject to any disclaimer, the term of this patent is extended or adjusted under 35 U.S.C. 154(b) by 0 days.

(21) Appl. No.: 09/340,929

(22) Filed: Jun. 28, 1999

(51) Int. Cl.[7] .................................................. H01L 21/336
(52) U.S. Cl. ........................ 438/303; 438/303; 438/304
(58) Field of Search .................................... 438/303, 305, 438/231, 528, 595, 592, 586, 655, 184, 304, 591

(56) References Cited

U.S. PATENT DOCUMENTS

| | | | |
|---|---|---|---|
| 5,851,890 | * 12/1998 | Tsai et al. | 438/303 |
| 5,923,986 | * 7/1999 | Shen | 438/303 |
| 5,953,615 | * 9/1999 | Yu | 438/303 |
| 6,015,747 | * 1/2000 | Lopatin et al. | 438/586 |

* cited by examiner

Primary Examiner—David Nelms
Assistant Examiner—Dung A Le
(74) Attorney, Agent, or Firm—Thomas, Kayden, Horstemeyer & Risley

(57) ABSTRACT

A fabrication method for a gate spacer. The method comprises provision of a substrate with a gate formed thereon, after which a $SiN_x$ spacer is formed on the gate sidewall. The substrate is then covered with a $SiO_x$ layer. A part of the $SiO_x$ layer is removed until the surface of the $SiO_x$ layer is lower than the top surface of the gate. A portion of the $SiN_x$ layer is removed to expose the top edge of the gate spacer and to increase the exposed area of the gate. The $SiO_x$ layer is consequently removed.

22 Claims, 2 Drawing Sheets

FABRICATION METHOD FOR GATE SPACER

BACKGROUND OF THE INVENTION

1. Field of Invention

The present invention relates to a fabrication method for a semiconductor substrate. More particularly, the present invention relates to a fabrication method for a gate spacer.

2. Description of Related Art

Concurrent with an increase in semiconductor device integration, it is common to decrease the size of the circuit structure device according to design rules, which gradually minimizes an integrated circuit (IC) device. However, the circuit resistance increases as the size of the semiconductor circuit design decreases without any material change.

Conventionally, several methods have been developed to solve the problem of increased sheet resistance from the interface between a polysilicon gate and a source/drain (S/D) region. One of these methods is a self-aligned silicide (salicide) process, which forms a silicide on the surface of the polysilicon gate and the S/D region to reduce the sheet resistance of the polysilicon gate and the S/D region.

However, since the surface area of the polysilicon gate and the S/D region for forming the silicide has become very small in the deep sub-micron process, a narrow linewidth effect readily occurs in the salicide process. One conventional method of increasing the area for forming the silicide is to over-etch the gate spacer, so that the height of the spacer is reduced. As a result, the top edge of the polysilicon gate is exposed to increase the surface area for forming the silicide.

Although this solves the problem related to the sheet resistance of the polysilicon gate, other problems develop. As the over-etching time lengthens, the height of the spacer decreases and the width of the spacer also reduces. Despite the increased surface area of the gate for forming the silicide, the width reduction of the spacer causes other related problems; for example, the width reduction of the lightly doped drain (LDD) leads to an enhanced short channel effect. Thus, it is not easy to control the duration of the over-etching process, which reduces the height of the spacer. In addition, the substrate surface of the S/D region is exposed during the over-etching process, so that the surface is damaged as a result of an increased etching time, leading to the problem of leakage current.

SUMMARY OF THE INVENTION

The invention provides a fabrication method for a gate spacer in which the height and width of a spacer can be independently controlled. The invention not only provides a surface area of the gate, which increases the silicide formation to reduce a resistance of the gate polysilicon layer, but also controls the width of the spacer. Therefore, the width of the spacer decreases with its height, while no damage is done to the substrate.

As embodied and broadly described herein, the invention provides a fabrication method for a gate spacer. The method includes providing a substrate and forming a gate on the substrate, wherein the gate is covered by a spacer, such as a $SiN_x$ layer. A liner oxide layer is selectively formed between the gate and the spacer to improve the adhesion. A S/D region is formed by doping at either sides of the gate on the substrate. The substrate is then covered with a sacrificial layer, such as a $SiO_x$ layer. A part of the sacrificial layer is removed until the surface of the remaining sacrificial layer is lower than the top surface of the gate. A part of the spacer is removed until a remaining spacer has a top portion between a top surface of the gate and a top surface of the sacrificial layer. As a result, the top edge of the gate spacer is exposed to increase the exposed area of the gate. The sacrificial layer is then removed, while a silicide layer, such as a $SiTi_x$ layer, is formed on the exposed surface of the gate and the S/D region to further reduce the sheet resistance.

According to the present invention, the height and width of the gate spacer can be independently controlled. Therefore, the sheet resistance of the polysilicon gate is reduced by increasing the reactive surface area for forming the silicide, while the damage to the substrate, which would otherwise induce the leakage current, is prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
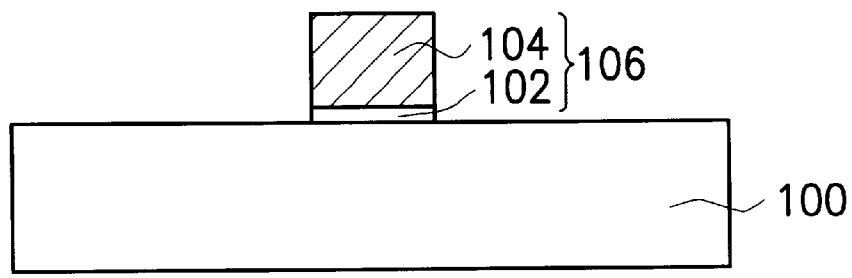
FIGS. 1A to 1F are schematic diagrams showing the process flow according to one preferred embodiment of this invention.

Referring to FIG. 1A, a silicon substrate 100 is provided. A gate 106 is formed on the substrate 100, wherein the gate 106 includes a gate oxide layer 102 and a gate conducting layer 104, which layers are stacked, in that order. The gate conducting layer 104 may be a polysilicon layer or a doped polysilicon layer, while the method may involve depositing a $SiO_x$ layer and a polysilicon layer in sequence by means of chemical vapor deposition (CVD). The gate conducting layer 104 and the gate oxide layer 102 are then patterned by photolithography and etching to define the location and the pattern of the gate 106, whereby the gate 106 is formed.

Figure 1B:
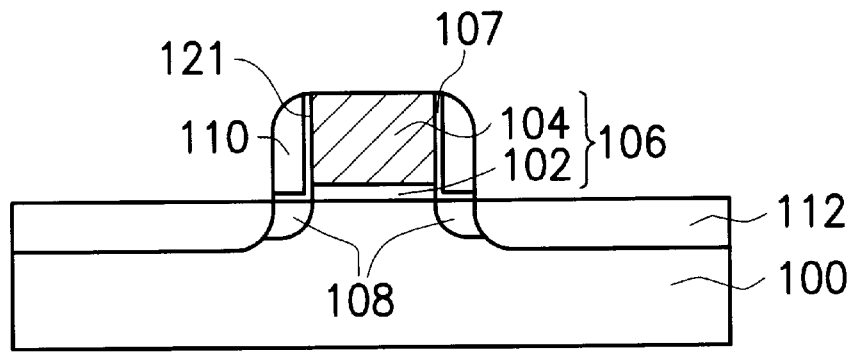

Referring to FIG. 1B, a lightly doped drain (LDD) is formed on either sides of the gate 106 in the substrate 100. This is achieved with a light doping by an ion implantation.

A spacer 110 is then formed on a sidewall 121 of the gate 106. The method may involve a conventional method, which covers the entire substrate 100 with an insulating layer, such as a $SiN_x$ layer. The spacer 110 is etched by dry etching to remove a part of the $SiN_x$ layer so that a $SiN_x$ spacer 110 is formed on the sidewall 121 of the gate 106.

As the spacer 110 can be made by the conventional fabrication method, it is not necessary to perform an over-etching, which would indirectly cause damage to a S/D region of the silicon substrate, to reduce a thickness of the spacer 110. Therefore, the formation of the spacer 110 does not cause damage to the silicon substrate of the S/D region. In addition, the width of the spacer 110 can be controlled by the width of the insulating layer and the degree of etching.

A heavy doping is then performed on the substrate 100 by ion implantation, so that the S/D region 112 is formed on either side of the gate 106.

Still referring to FIG. 1B, a thin liner oxide layer 107 is selectively formed on the sidewall 121 of the gate 106 before forming the spacer 110. Preferably, the liner oxide layer 107 may be a high temperature thermal oxide (HTO) layer or a $SiO_x$ layer with a thickness of about 100–200 Å deposited by plasma enhanced chemical vapor deposition (PECVD), which layers improve the adhesion and the stress between the spacer 110 and the gate 106.

Figure 1C:
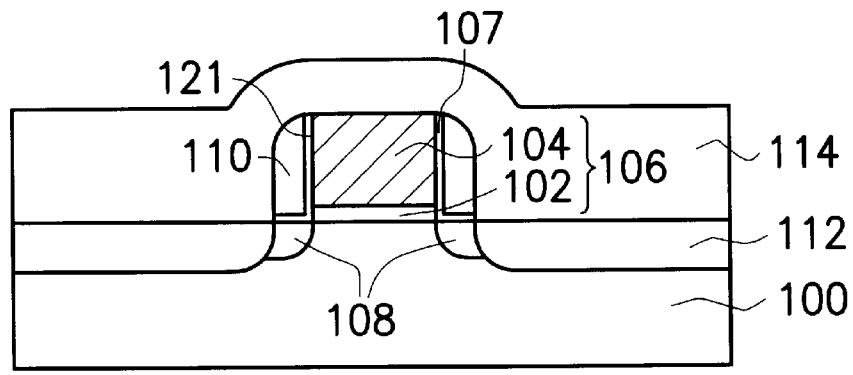

Referring to FIG. 1C, the entire substrate 100 is covered with a sacrificial layer 114. The sacrificial layer 114 may be a $SiO_x$ layer deposited by PECVD or a spin-on glass (SOG).

Figure 1D:
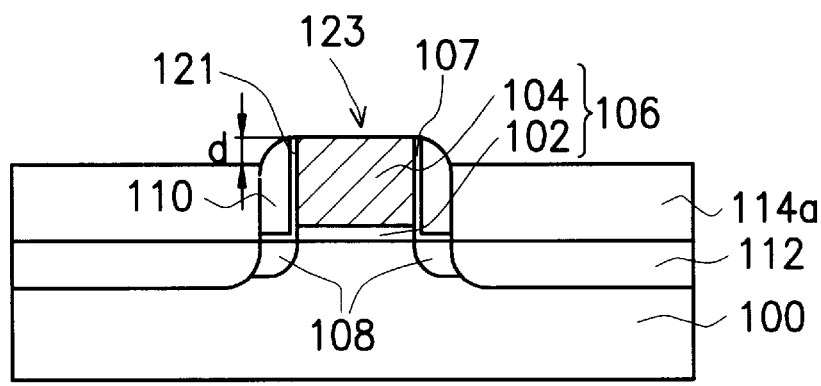

Referring to FIG. 1D, a part of the sacrificial layer 114 is removed by etching back until the surface of the sacrificial layer 114 is lower than the top surface 123 (i.e. the top surface of the gate conducting layer 104) of the gate 106 and thus resulting in the sacrificial layer 114a. In this step, the exposed area of the gate sidewall 121 can be indirectly controlled by the distance (d) between the surface of the sacrificial layer 114a and the top surface 123 of the gate 106.

Figure 1E:
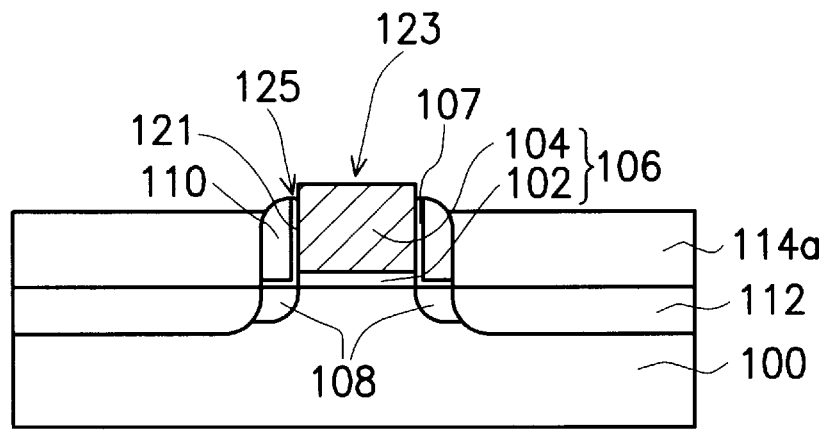

Referring to FIG. 1E, the top portion of the first spacer 110 is removed by wet etching, with the sacrificial layer 114a as the stop layer. A recess 125 is formed on the top edge of the sidewall 121 of the gate 106, so that the spacer 110 becomes a spacer 110a with a lower thickness. This spacer 110a exposes the top edge of the sidewall 121 of the gate 106 which increases the surface area of the gate conducting layer 104.

In the invention, the height of the spacer 110a is solely controlled to control the area of the gate conducting layer 104, while the width of the spacer 110a is not influenced. This prevents the related problem brought by the width reduction of the gate spacer, for example the increased short channel effect, which corresponds to the width reduction of the LDD. Therefore, the invention can independently control the thickness and width of the spacer 110, and a required spacer profile can be formed.

Figure 1F:
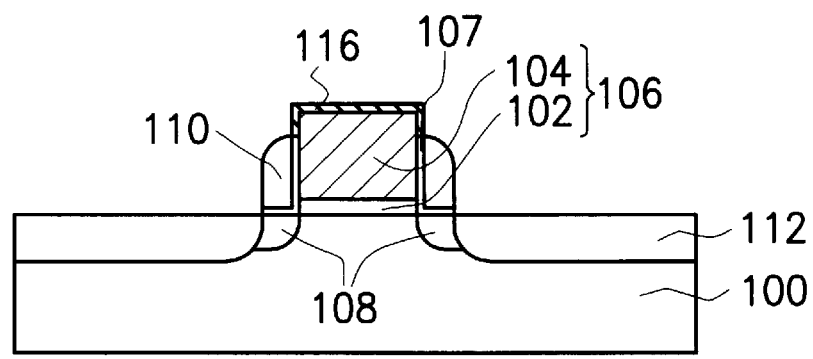

Referring to FIG. 1F, a metallization process is performed. A silicide layer 116 is formed on the surface of the gate conducting layer 104 to lower a contact resistance. The silicide layer 116 may be a $SiTi_x$ layer or a $SiCo_x$ layer formed by a self-aligned silicide (salicide) process. Besides the $SiTi_x$ layer and the $SiCo_x$ layer, the silicide layer 116 may use other materials such as $MoSi_2$, $Pd_2Si$, $PtSi$, $TaSi_2$, and $WSi_2$. The sacrificial layer 114a is subsequently removed by wet etching.

It is understood from the above embodiment that the thickness and width of the spacer can be independently controlled in the invention without damaging the S/D region. Therefore, the narrow linewidth effect in the metallization process is prevented by increasing the surface area of the gate conducting layer so as to lower the gate contact resistance. In addition, the width of the gate spacer is controlled to prevent the related problems caused by the width reduction of the gate spacer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a gate spacer, the method comprising steps of:
   providing a substrate, wherein the substrate has a gate formed thereon;
   forming a spacer on a sidewall of the gate;
   covering the substrate with a sacrificial layer;
   removing a part of the sacrificial layer until a surface of the sacrificial layer is lower than a top surface of the gate;
   removing a thickness of the spacer without reducing a width thereof until a remaining spacer has a top portion between the top surface of the gate and a top surface of the sacrificial layer, wherein the sacrificial layer covers a lower portion of the spacer and exposes an upper portion of the spacer;
   removing the sacrificial layer; and
   performing a silicidation step.

2. The fabrication method of claim 1, wherein a liner oxide layer is formed on the sidewall of the gate before forming the spacer.

3. The fabrication method of claim 1, wherein the method for forming the spacer comprises steps of:
   covering the substrate with an insulating layer; and
   etching the insulating layer to form the spacer.

4. The fabrication method of claim 1, wherein the spacer includes $SiN_x$.

5. The fabrication method of claim 1, wherein the sacrificial layer includes $SiO_x$.

6. The fabrication method of claim 1, wherein depositing the sacrificial layer includes plasma chemical vapor deposition.

7. The fabrication method of claim 1, wherein the sacrificial layer includes spin-on glass (SOG).

8. A fabrication method for a gate structure, the method comprising steps of:
   providing a substrate;
   forming a gate on the substrate and source/drain regions at both sides of the gate, wherein the gate is covered by a spacer;
   covering the substrate including the source/drain regions, the gate and the spacer with a sacrificial layer;
   removing a part of the sacrificial layer until a surface of the sacrificial layer is lower than a top surface of the gate, wherein the sacrificial layer covers a lower portion of the spacer and exposes an upper portion of the spacer;
   removing a part of the spacer until a remaining spacer has a top portion between the top surface of the gate and a top surface of the sacrificial layer, so that a part of a sidewall of the gate is exposed;
   removing the sacrificial layer; and
   forming a silicide layer on a surface exposed by the gate.

9. The fabrication method of claim 8, wherein the gate includes a polysilicon layer.

10. The fabrication method of claim 8, wherein a liner oxide layer is formed on the sidewall of the gate before forming the spacer.

11. The fabrication method of claim 8, wherein the method for forming the spacer comprises steps of:
    covering the substrate with an insulating layer; and
    etching the insulating layer to form the spacer.

12. The fabrication method of claim 8, wherein the spacer includes $SiN_x$.

13. The fabrication method of claim 8, wherein the sacrificial layer includes $SiO_x$.

14. The fabrication method of claim 8, wherein depositing the sacrificial layer includes plasma chemical vapor deposition.

15. The fabrication method of claim 8, wherein the sacrificial layer includes a SOG.

16. The fabrication method of claim 8, wherein the method for forming the silicide layer includes a salicide process.

17. A fabrication method for a transistor, the method comprising steps of:

providing a substrate;

forming a gate on the substrate, wherein the gate is covered by a $SiN_x$ spacer forming a liner oxide layer between the gate and the $SiN_x$ spacer;

forming a lightly doped drain (LDD) on either side of the gate in the substrate;

covering a $SiO_x$ layer on the substrate including the LDD region, the gate, and the $SiN_x$ spacer;

removing a part of the $SiO_x$ layer until a surface of the $SiO_x$ layer is lower than a top surface of the gate, wherein the $SiO_x$ layer covers a lower portion of the $SiN_x$ spacer and exposes an upper portion of the $SiN_x$ spacer;

removing a thickness of the $SiN_x$ spacer without reducing a width thereof until a remaining $SiN_x$ spacer has a top portion between the top surface of the gate and a top surface of the $SiO_x$ layer;

removing the $SiO_x$ layer; and forming a silicide layer on a surface exposed by the gate and the S/D region.

18. The fabrication method of claim 17, wherein the gate includes a polysilicon layer.

19. The fabrication method of claim 17, wherein a lightly doped drain (LDD) is formed on either side of the gate before forming the $SiN_x$ spacer.

20. The fabrication method of claim 17, wherein the method for forming the $SiN_x$ spacer comprises steps of:

covering the substrate with an insulating layer; and etching the insulating layer to form the $SiN_x$ spacer.

21. The fabrication method of claim 17, wherein the method for forming the silicide layer includes a salicide process.

22. The fabrication method of claim 17, wherein the silicide layer includes a $SiTi_x$ layer.

* * * * *